United States Patent
Tsai et al.

(10) Patent No.: US 8,339,799 B2
(45) Date of Patent: Dec. 25, 2012

(54) INTEGRATED CIRCUIT WITH PINS AT MULTIPLE EDGES OF A CHIP

(75) Inventors: Huan-Shang Tsai, Cupertino, CA (US); Jie Tang, Fogelsville, PA (US)

(73) Assignee: Infinera Corporation, Sunnyvale, CA (US)

( * ) Notice: Subject to any disclaimer, the term of this patent is extended or adjusted under 35 U.S.C. 154(b) by 536 days.

(21) Appl. No.: 12/550,446

(22) Filed: Aug. 31, 2009

(65) Prior Publication Data

US 2011/0052117 A1    Mar. 3, 2011

(51) Int. Cl.
*H05K 7/10* (2006.01)
*H05K 7/12* (2006.01)

(52) U.S. Cl. ......... 361/767; 361/760; 361/764; 361/782

(58) Field of Classification Search .......... 361/760–764, 361/782–784; 257/723–724, 777–780
See application file for complete search history.

(56) References Cited

U.S. PATENT DOCUMENTS

| | | | |
|---|---|---|---|
| 6,215,192 B1* | 4/2001 | Hirata et al. | 257/777 |
| 6,291,880 B1* | 9/2001 | Ogawa et al. | 257/723 |
| 7,843,700 B2* | 11/2010 | Fukuda et al. | 361/760 |
| 2002/0003298 A1* | 1/2002 | Koriyama et al. | 257/728 |
| 2004/0208592 A1* | 10/2004 | Kirkpatrick et al. | 398/117 |

* cited by examiner

*Primary Examiner* — Tuan T Dinh
(74) *Attorney, Agent, or Firm* — David L. Soltz

(57) ABSTRACT

An improved integrated circuit (IC) layout is described that provides conductive pads on opposite sides of a substrate. The conductive pads provide for connectivity to the chip in different chip orientations. Accordingly, multiple chips having the same layout can be provided in a package, instead of providing each chip with a different layout. Since the same layout may be used for each chip, manufacturing costs are reduced.

18 Claims, 4 Drawing Sheets

INTEGRATED CIRCUIT WITH PINS AT MULTIPLE EDGES OF A CHIP

BACKGROUND

1. Field of the Invention

The disclosed devices relate to integrated circuit chips. More specifically, the disclosed devices relate to the positioning of conductive pads for electrical potentials on an integrated circuit chip.

2. Discussion of Related Art

Conventional integrated circuit packages (ICs) include a plurality of contact elements, such as pins, balls, or pads, which are arranged in a pattern that corresponds to a receiving cavity in a package into which the IC is to be inserted. The design of conventional ICs require the IC to be coupled to the package in a specific orientation to ensure that the proper contact elements engage the corresponding contact elements of the package.

Improper insertion of the IC into a package compromises the operation of the electronic device and/or may cause damage to the device itself. Additional steps are taken during the manufacturing of a package to ensure proper insertion of the ICs into the package. In some instances, it is desirable to have several ICs having the same functionality designed and manufactured for use within a single package. The additional steps taken to ensure proper placement of an IC and/or the additional steps taken to design and manufacture a functionally identical IC having different pin-out and/or power locations increases manufacturing costs of the IC device. Accordingly, there is a need for an improved IC package that takes advantage of a plurality of conductors to supply electrical potentials to the package utilizing a single IC design.

SUMMARY OF THE INVENTION

In one embodiment, a device includes a package having a plurality of sides, first and second pluralities of conductors, and a chip having first and second edges. The first plurality of conductors are provided along a first portion of one of the plurality of sides of the package with each of the first plurality of conductors supplying a corresponding one of a plurality of potentials. The second plurality of conductors are provided along a second portion of the one of the plurality of sides of the package with each of the second plurality of conductors supplying a corresponding one of the plurality of potentials. A first plurality of conductive pads are provided along the first edge of the chip, and a second plurality of conductive pads being provided along the second edge of the chip. The package includes first and second portions, both of which are configured to receive the chip. When the chip is provided in the first portion of the package, the chip is oriented so that the first plurality of conductive pads are spaced closer to the first plurality of conductors than the second plurality of conductive pads and the first plurality of conductors are electrically connected to the first plurality of conductive pads. When the chip is provided in the second portion of the package, the second plurality of conductive pads are provided closer to the second plurality of conductors than the first plurality of conductive pads and the second plurality of conductors are electrically connected to the second plurality of conductive pads.

In another embodiment, a device includes a package having a plurality of sides, first and second pluralities of conductors, and first and second chips each having first and second edges and first and second bonding pads. The first plurality of conductors are provided along a first portion of one of the plurality of sides of the package. Each of the plurality of conductors supply a corresponding one of a plurality of potentials. The second plurality of conductors are provided along a second portion of said one of the plurality of sides of the package. Each of the second plurality of conductors supply a corresponding one of the plurality of potentials. The first plurality of bonding pads are provided along the first edge of the first chip, and the second plurality of bonding pads are provided along the second edge of the first chip. Each of the first plurality of bonding pads are electrically connected to a corresponding one of the second plurality of bonding pads. The first plurality of bonding pads of the second chip are provided along the first edge of the second chip, and the second plurality of bonding pads of the second chip are provided along the second edge of the second chip. Each of the first plurality of bonding pads of the second chip are electrically connected to a corresponding one of the second plurality of bonding pads of the second chip. The first plurality of bonding pads of the first chip are also electrically connected to the first plurality of conductors, and the first plurality of bonding pads of the second chip are also electrically connected to the second plurality of conductors, the first and second chips being provided in the package.

DESCRIPTION OF EMBODIMENTS

Figure 1:
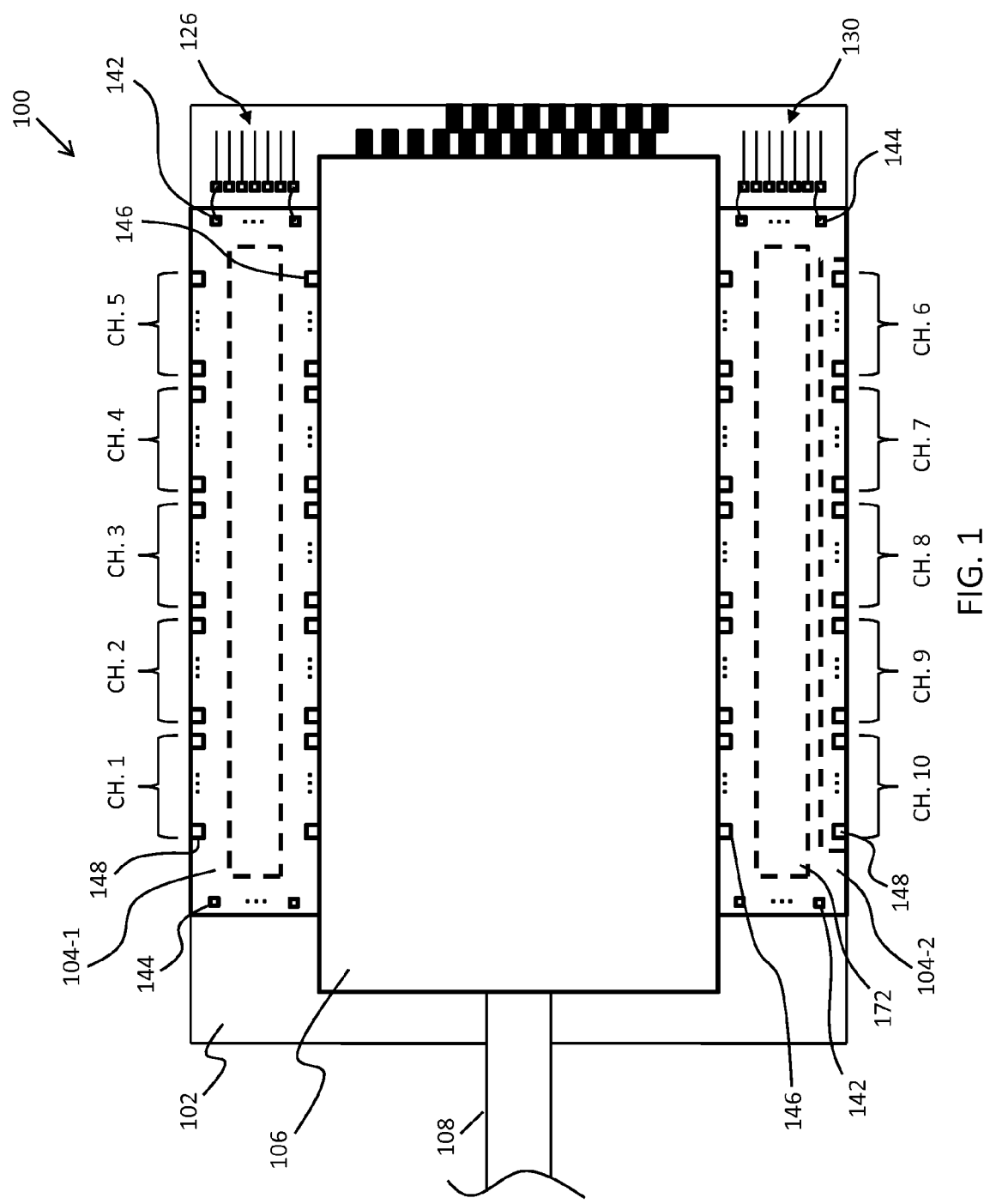
FIG. 1 is an assembly view of one example of an improved device including a package of integrated circuits.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout An improved integrated circuit (IC) layout is described that provides conductive pads on opposite sides of a substrate. The conductive pads provide for connectivity to the chip in different chip orientations. Accordingly, multiple chips having the same layout can be provided in a package, instead of providing each chip with a different layout. Since the same layout may be used for each chip, manufacturing costs are reduced.

For the purposes of this document, an IC chip may refer to any chip having a circuit formed thereon including, but not limited to, a semiconductor IC, a planar lightwave circuit (PLC), photonic integrated circuit, or the like. FIG. 1 illustrates an exemplary device 100 including a package 102 having a plurality of integrated circuit chips 104-1, 104-2 and 106 connected thereto. A fiber 108 may be coupled to chip 106 at one side of the package 102. Chip 106 may also include output ports that provide respective signals to devices 146 which may, for example, photodetectors. The package 102 may be mounted on a printed circuit board (PCB) (not shown) as will be understood by one skilled in the art. Each chip 104-1 and 104-2 has corresponding first and second plurality of contact pads or pins 142 and 144. Depending on the orientations of chips 104-1 and 104-2, contact pads 142 or 144 are connected to a first or second plurality of conductors 126 or 130. For example, chip 104-1 may be oriented such that the first plurality of contact pads 142 are spaced closer to the first plurality of conductors 126. Similarly, chip 104-2 may be oriented such that the second plurality of contact pads 144 are spaced closer to the second plurality of conductors 130. Preferably, as discussed in greater detail below, chips or ASIC 104-1 and 104-2 have the same or similar layout or design.

Figure 2:
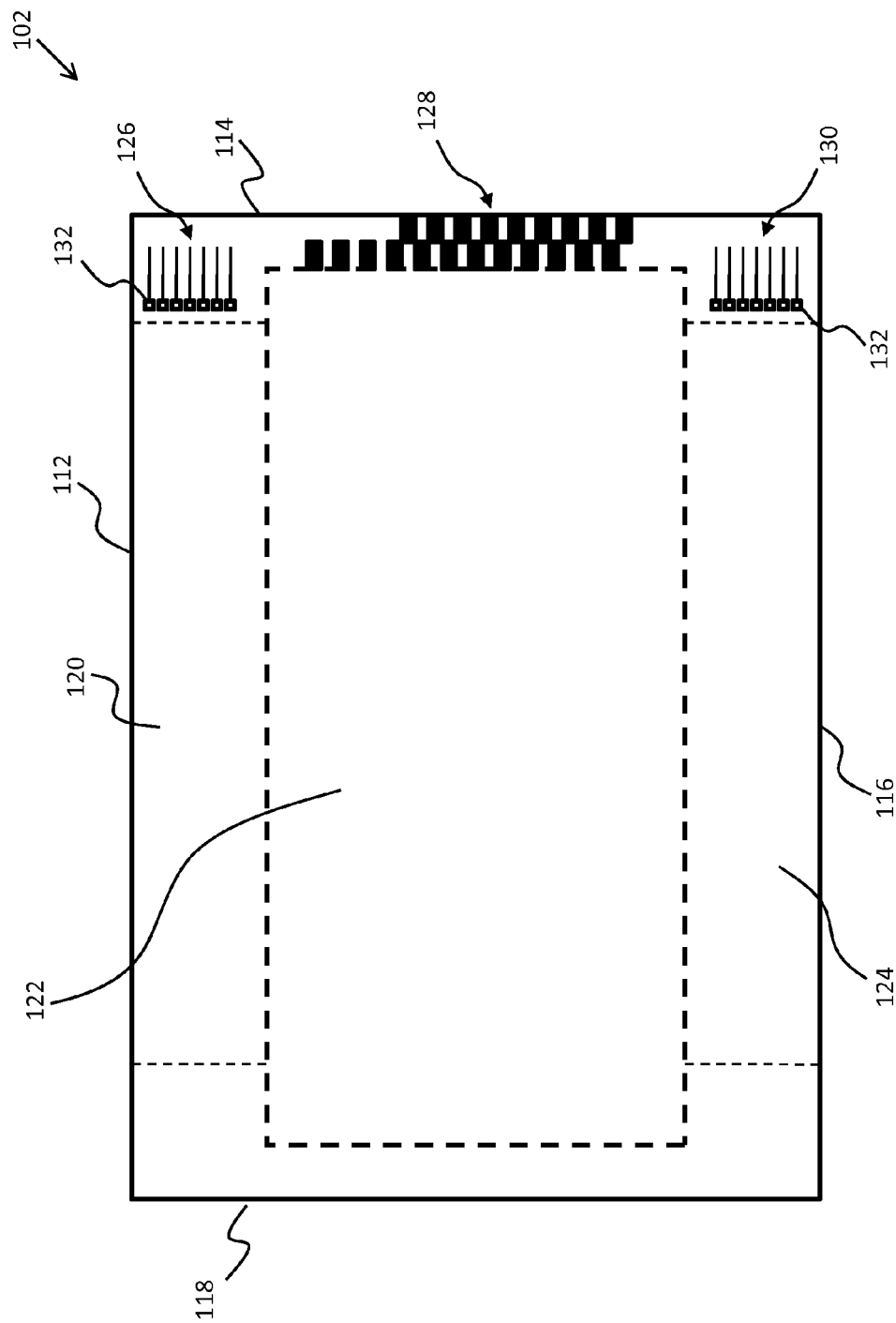
FIG. 2 illustrates one example of the package in accordance with the improved integrated circuit package illustrated in FIG. 1.

FIG. 2 illustrates one example of a package 102 with the IC chips 104-1, 104-2, 106 and fiber 108 having been removed. As shown in FIG. 2, package 102 may have a rectangular geometry with sides 112, 114, 116, and 118. One skilled in the art will understand that the package 102 may have a variety of geometries other than a rectangular geometry with a varying number of sides. Package 102 includes several portions 120, 122, and 124 each configured to have a corresponding one of IC chips 104-1, 104-2, and 106 bonded or otherwise affixed thereto. Each portion 120, 122, and 124 of the package 102 may include a respective set of conductive leads or conductors 126 and 130 for providing power to the IC chips 104-1, 104-2, and 106, respectively. Conductors or pads 128 provide power and control signals to control elements, such as heaters, on chip (planar lightwave circuit—PLC) 106, described in greater detail below with reference to FIG. 4. Each set of conductors 126, 128, and 130 may include pads 132 for providing a direct current (DC) voltage potential to the IC chips 104-1, 104-2, and 106. The pads 132 may be wire bonded to bonding pads 142, 144 located on the chips 104-1, 104-2, and 106 as described in more detail below. As will be understood by one skilled in the art, package 102 may also include additional power and signal traces (not shown) for routing DC power and control signals to and from each of the chips 104-1, 104-2, and 106 coupled to package 102 and to the PCB.

Figure 3:
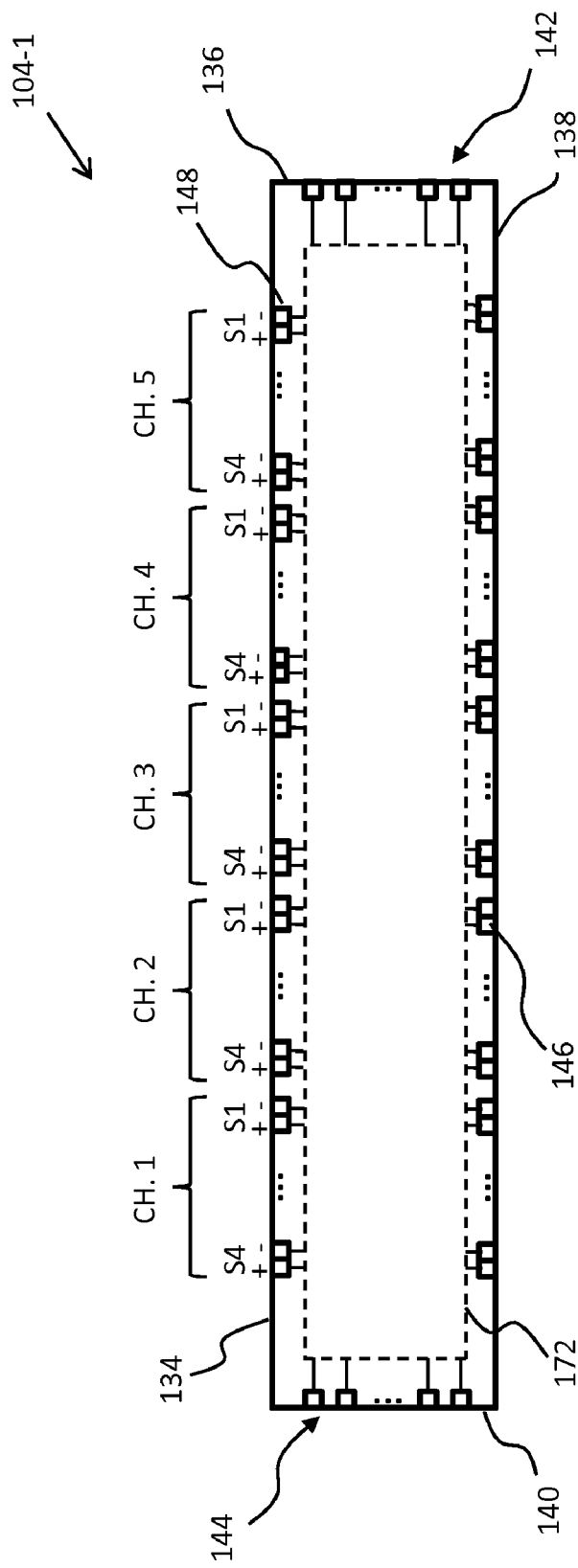
FIG. 3 illustrates one example of an improved ASIC in accordance with the improved integrated circuit package illustrated in FIG. 1.

FIG. 3 illustrates an exemplary application-specific integrated circuit (ASIC) chips 104-1 that may be coupled to the package 102. It is understood, the ASIC 104-2 may have the same or similar layout or design as that of ASIC 104-1 shown in FIG. 3. In one example, ASIC 104-1 received optical signals associated with five optical channels (5λ). ASICs 104-1 includes transimpedance amplifiers (TIAs) and multiple-input-multiple-output (MIMO) circuitry, as described for example in U.S. patent application Ser. No. 12/052,541, filed Mar. 20, 2008, the contents of which are incorporated herein by reference. However, one skilled in the art will understand ASIC 104-1 may be another type of ASIC. As shown in FIG. 3, ASIC 104-1 may have a rectangular shape with sides or edges 134, 136, 138, and 140. A set of bonding pads 142 and 144 are respectively disposed along opposite, parallel edges 136 and 140 of the ASIC 104-1. The conductive bonding pads 142, 144 may be fabricated from gold, silver, copper, aluminum, solder, or any electrically conductive material as will be understood by one skilled in the art. Each set of conductive bonding pads 142 and 144 is configured to be wire bonded or otherwise coupled to pads 132 and conductors 126 and 130 on package 102. Locating conductive bonding pads 142, 144 at opposite ends of the ASIC 104-1 advantageously enables a single ASIC design, for example, to be used in different orientations within a single package, e.g., in either slot/portion 120 or 124 of the package 102. In some embodiments, a bonding pad in one set of bonding pads, e.g., conductive bonding pads 142, is electrically coupled to a respective bonding pad in the opposing set of bonding pads, e.g., conductive bonding pads 144.

ASIC 104-1 may also include an array of photodetectors 146, which may be implemented for detecting a light signal and generating an electrical signal in response to the detected light. As further shown in FIG. 3, the array of photodetectors 146 are disposed along the edge 138, which is located between the edges 136 and 140 that include the arrays of conductive bonding pads 142 and 144. The outputs of photodetectors or photodiodes 146 are supplied to circuitry 172, which may include the TIA and MIMO circuitry noted above. The outputs of circuitry 172 are supplied to contacts or pads 148 as signals S1+/− to S4+/− associated with each of channels CH.1 to CH.5.

Figure 4:
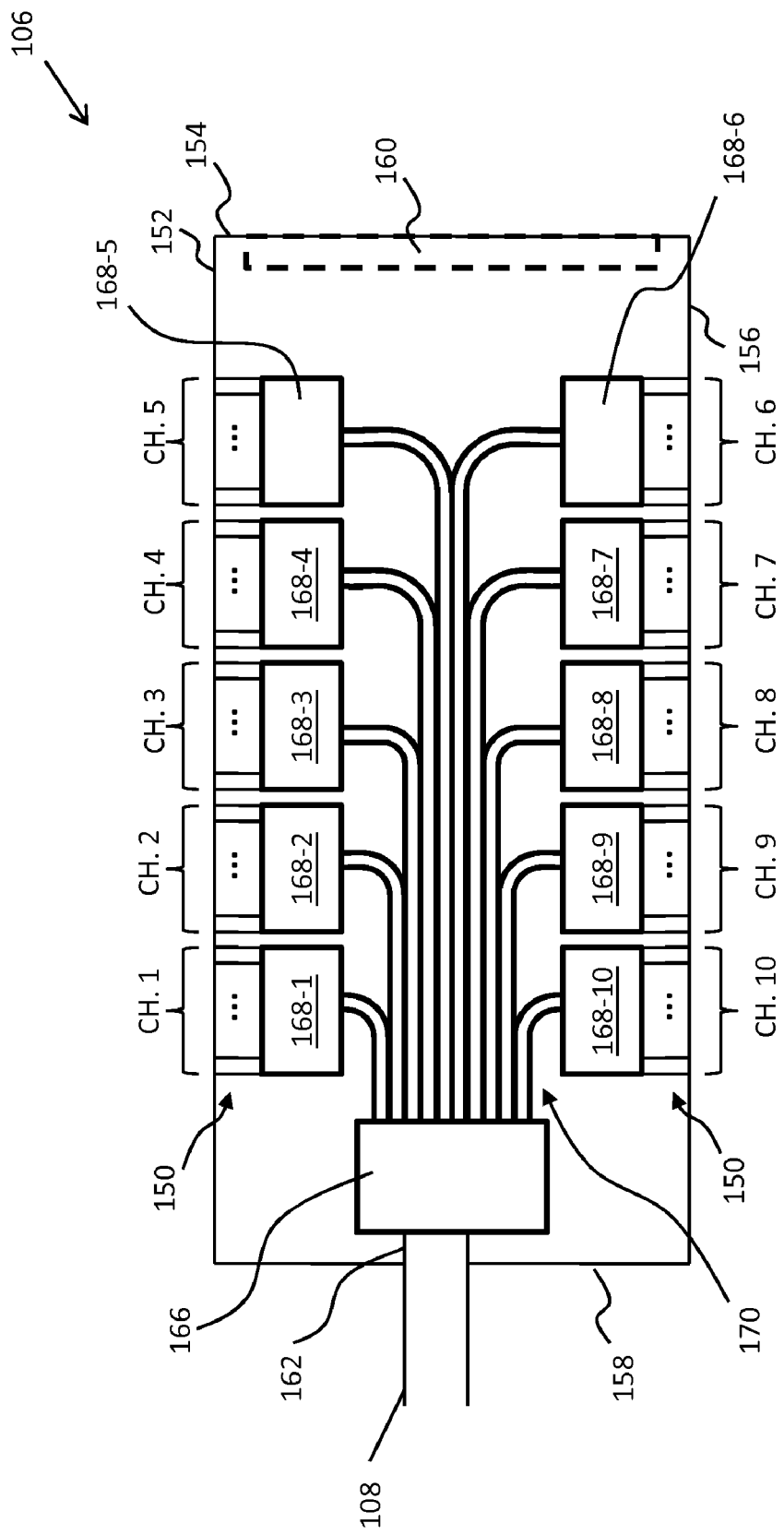
FIG. 4 illustrates one example of a planar lightwave circuit chip in accordance with the improved integrated circuit package illustrated in FIG. 1.

FIG. 4 illustrates an exemplary PLC chip 106 having a plurality of optical waveguides 150, 170 disposed thereon. As shown in FIG. 4, PLC 106 has a rectangular shape having edges 152, 154, 156, and 158. Output optical waveguides 150 are disposed along edges 152 and 154, and input optical fiber 108 is disposed at edge 158, and may include a mode adapter or other interface 162 for connecting the PLC 106 to fiber 108 as illustrated in FIG. 1. PLC 106 may include an array of bonding pads 160 along the edge 154 for coupling to conductors 128 located on the package 102. Each of the conductive bonding pads 160 may receive a DC voltage or control voltages from a corresponding one of conductors 128. These voltages may be supplied to heaters (e.g. resistive films) provided on PLC 106 for tuning the optical signals traveling along the optical waveguides 150, 164, and 170 on the PLC 106.

As further shown in FIG. 4, PLC 106 may include functional circuitry disposed thereon. For example, PLC 106 may include a demultiplexer 166, such as an arrayed waveguide grating (AWG), configured to demultiplex a wavelength division multiplexed (WDM) optical signal received from fiber 108. Other examples of optical circuits that may be disposed on PLC 106 include, but are not limited to, Bragg gratings, optical add-drop demultiplexers, Mach-Zehnder deinterleavers, or the like. A plurality of waveguides 170 couple the demultiplexed optical signals output from demultiplexer 166 to a plurality of optical hybrid circuits 168-1-168-10, e.g., 90 degree optical hybrid circuits (collectively referred to as "optical hybrids 168") for optical processing of the demultiplexed optical signals. The outputs of the of optical hybrids 168 are supplied to the output waveguides 150, groups of which are associated with each of channels or wavelengths CH. 1 to CH. 10, for example. In one embodiment, the number of output waveguides disposed along one edge of the PLC chip 106, e.g., edge 152, may be equal to the number of output waveguides 150 disposed along the opposite edge of the PLC chip 106, e.g., edge 156.

The device 100 may be assembled by wire bonding or otherwise connecting the IC chips 104-1, 104-2, and 106 to the package 102. For example, PLC 106 may be coupled to portion 122 of PCB 102 by wire bonding the conductive pads 160 of PLC 106 to the corresponding conductors 128 disposed on PCB 102. A first ASIC, e.g., ASIC 104-1, may be coupled to portion 120 of PCB 102 by having conductive bonding pads 142 disposed along edge 136 be wire bonded to the pads 132 coupled to conductors 126 on package 102. Advantageously, a second ASIC, ASIC 104-2, having the same design as the first ASIC 104-1, may be coupled to portion 124 of PCB 102 by wire bonding conductive pads 144 disposed along edge 140 to the pads 132 of the set of conductors 130 disposed on package 102. Accordingly, the same layout may be used for both ASICs 104-1 and 104-2, and, as noted above, ASIC 104-1 is provided in portion 120, while ASIC 104-2 is rotated 180 degrees relative to ASIC 104 and is provided in portion 124. Electrical connections are made through pads 142 of ASIC 104-1 and through pads 144 of ASIC 104-2 (see FIGS. 1 and 2). Typically, pads 144 of ASIC 104-1 are not connected to receive an electrical signal, such as a voltage, and, likewise pads 142 of ASIC 104-2 are similarly disconnected because the presence of fiber 108 adjacent these pads would otherwise make connections to them difficult. As noted above, however, connections are made through pads 142 of ASIC 104-1 and pads 144 of ASIC 104-2. By providing redundant pads, such as pads 142 and 144 in ASICs 104-1 and 104-2, the same ASIC (i.e., ASICs having the same layout or design) may be utilized at different locations within package 102 by changing the orientation of the ASIC with respect to the package 102, and still accommodate fiber 108. As noted above, fiber 108 may be connected to mode adapter 162 in package 102.

In operation, fiber 108 may supply a WDM optical input signal having a plurality of channels (e.g., 10) in which each channel corresponds to a different wavelength. The optical signals from the fiber 108 are received at the input optical waveguides 164 on PLC 106 through mode adapter 162. As described above, PLC 106 may be configured to demultiplex the WDM optical input signal and route each of the channels to the output waveguides 150 located on either side of the PLC 106. For example, the WDM optical input signal may have ten channels, e.g., λ1, λ2, . . . λ10, which are demultiplexed and processed (e.g., polarization rotated and delayed) by the internal circuitry on the PLC 106, e.g., demultiplexer 166 and optical hybrids 168 as shown in FIG. 4. The outputs of optical hybrids 168 may be routed to output waveguides 150 disposed along edges 152 and 156 of PLC 106 with outputs associated with wavelengths λ1-λ5 being routed to the output waveguides 150 located along the edge 152 of PLC 106 and outputs associated with wavelengths λ6-λ10 being routed to the output waveguides 150 disposed along the edge 156 of PLC 106 as shown in FIG. 1.

ASICs 104-1 and 104-2, having the same number of photodetectors 146, are disposed on either side of the PLC 106 such that each of the photodetectors 146 is aligned with a respective output waveguide 150 of the PLC 106. Accordingly, each photodetector 146 receives an optical signal from a corresponding output waveguide 150 and converts it to a corresponding electrical signal. The electrical signals output from the photodetectors or photodiodes 146 may be amplified by the internal circuitry 172, e.g., by the TIAs discussed above, and processed by the MIMO circuitry further noted above. The output of the MIMO circuitry, in turn, is supplied to output contacts 148 disposed along edge 134 of each of ASICs 104-1 and 104-2. The improved layout structure for the ASICs as described above advantageously enables a single ASIC design to be integrated into an IC package in a variety of configurations. Accordingly, the design and manufacturing costs associated with an IC package will be reduced due to the increased flexibility of the ASIC.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. A device, comprising:
a package having a plurality of sides,
a first plurality of conductors, each of the first plurality of conductors supplying a corresponding one of a plurality of potentials, the first plurality of conductors being provided along a first portion of one of the plurality of sides of the package;
a second plurality of conductors, each of the second plurality of conductors supplying a corresponding one of the plurality of potentials, the second plurality of conductors being provided along a second portion of said one of the plurality of sides of the package;
a first chip having first and second edges;
a first plurality of conductive pads being provided along the first edge of the first chip;
a second plurality of conductive pads being provided along the second edge of the first chip,
wherein the package includes first and second portions, both of which are configured to receive the first chip, such that, when the first chip is provided in the first portion of the package, the first chip is oriented so that the first plurality of conductive pads are spaced closer to the first plurality of conductors than the second plurality of conductive pads, and the first plurality of conductors are electrically connected to the first plurality of conductive pads, and, when the first chip is provided in the second portion of the package, the second plurality of conductive pads are provided closer to the second plurality of conductors than the first plurality of conductive pads, and the second plurality of conductors are electrically connected to the second plurality of conductive pads; and
a second chip having a plurality of optical waveguides;
a plurality of photodetectors provided on the first chip, the plurality of optical waveguides being configured to direct each of a plurality of optical signals to a corresponding one of the plurality of photodetectors.

2. The device in accordance with claim 1, wherein each of the plurality of potentials is a direct current (DC) potential.

3. The device in accordance with claim 1, wherein the first edge is provided opposite the second edge.

4. The device in accordance with claim 1, wherein the first edge extends parallel to the second edge.

5. The device in accordance with claim 1, wherein said one of the plurality of sides of the package is a first one of the plurality of sides of the package, an optical signal being supplied to a second one of the plurality of sides of the package.

6. The device in accordance with claim 1, wherein each of the plurality of photodetectors is provided along a third edge of the second chip.

7. The device in accordance with claim 1, wherein said one of the plurality of sides of the package is a first one of the plurality of sides of the package, the plurality of optical signals are supplied to a second one of the plurality of sides of the package to the plurality of waveguides.

8. The device in accordance with claim 5, wherein the first one of the plurality of sides of the package is opposite the second one of the plurality of sides of the package.

9. The device in accordance with claim 7, wherein the first one of the plurality of sides of the package is opposite the second one of the plurality of sides of the package.

10. A device comprising:
a package having a plurality of sides,
a first plurality of conductors, each of the first plurality of conductors supplying a corresponding one of a plurality of potentials, the first plurality of conductors being provided along a first portion of one of the plurality of sides of the package;

a second plurality of conductors, each of the second plurality of conductors supplying a corresponding one of the plurality of potentials, the second plurality of conductors being provided along a second portion of said one of the plurality of sides of the package;

a first chip having first and second edges and first and second pluralities of bonding pads, the first plurality of bonding pads being provided along the first edge of the first chip and the second plurality of bonding pads being provided along the second edge of the first chip, each of the first plurality of bonding pads being electrically connected to a corresponding one of the second plurality of bonding pads;

a second chip having first and second edges and first and second pluralities of bonding pads, the first plurality of bonding pads of the second chip being provided along the first edge of the second chip and the second plurality of bonding pads of the second chip being provided along the second edge of the second chip, each of the first plurality of bonding pads of the second chip being electrically connected to a corresponding one of the second plurality of bonding pads of the second chip, wherein the first plurality of bonding pads of the first chip are also electrically connected to the first plurality of conductors, and the first plurality of bonding pads of the second chip are also electrically connected to the second plurality of conductors, the first and second chips being provided in the package; and a third chip provided in the package, the third chip including a plurality of waveguides that are configured to supply first and second pluralities of optical signals to the first and second chips, respectively.

11. The device in accordance with claim 10, wherein the first plurality of bonding pads of the first chip are closer to the first plurality of conductors than the second plurality of bonding pads of the first chip, and the first plurality of bonding pads of the second chip are closer to the second plurality of conductors than the second plurality of bonding pads of the second chip.

12. The device in accordance with claim 10, wherein the third chip is provided between the first and second chips.

13. The device in accordance with claim 10, wherein a first plurality of photodetectors are provided on the first chip and a second plurality of photodetectors are provided on the second chip, each of the first plurality of photodetectors receiving a corresponding one of the first plurality of optical signals and each of the second plurality of photodetectors receiving a corresponding one of the second plurality of optical signals.

14. The device in accordance with claim 10, wherein each of the plurality of potentials is a direct current (DC) potential.

15. The device in accordance with claim 10, wherein the first edge of the first chip is provided opposite the second edge of the second chip and the first edge of the second chip is provided opposite the second edge of the second chip.

16. The device in accordance with claim 10, wherein said one of the plurality of sides of the package is a first one of the plurality of sides of the package, the first and second pluralities of optical signals being supplied from a second one of the plurality of sides of the package.

17. The device in accordance with claim 13, wherein a number of the first plurality of photodetectors is the same as a number of the second plurality of photodetectors.

18. The device in accordance with claim 16, wherein second one of the plurality of sides of the package includes an opening, the opening being configured to receive an end portion of an optical fiber, the optical fiber providing the first and second pluralities of optical signals.

\* \* \* \* \*